United States Patent [19]
Roser et al.

[11] Patent Number: 5,217,813
[45] Date of Patent: Jun. 8, 1993

[54] POLYETHYLENEIMINE AND POLYVINYLAMINE DERIVATIVES, ALUMINUM-BASED SUBSTRATE MATERIALS COATED WITH THESE DERIVATIVES AND THE USE THEREOF FOR THE PRODUCTION OF OFFSET PRINTING PLATES

[75] Inventors: Joachim Roser, Mannheim; Juergen Mohr, Gruenstadt; Armin Lange, Heidelberg; Knut Oppenlaender, Ludwigshafen; Walter Denzinger, Speyer; Thomas Loerzer, Neustadt, all of Fed. Rep. of Germany

[73] Assignee: BASF Aktiengesellschaft, Ludwigshafen, Fed. Rep. of Germany

[21] Appl. No.: 805,179

[22] Filed: Dec. 11, 1991

[30] Foreign Application Priority Data

Dec. 14, 1990 [DE] Fed. Rep. of Germany ....... 4039920

[51] Int. Cl.$^5$ ............................................. B32B 15/08
[52] U.S. Cl. ..................................... 428/461; 526/278; 526/287
[58] Field of Search ............... 430/58, 56, 309, 278, 430/60; 205/204; 427/405; 526/278, 287; 428/461

[56] References Cited
U.S. PATENT DOCUMENTS

| | | | |
|---|---|---|---|
| 3,276,868 | 10/1966 | Uhlig | 430/60 |
| 3,879,199 | 4/1975 | Trubisky | 430/58 |
| 3,900,370 | 8/1975 | Germscheid et al. | 205/204 |
| 4,153,461 | 5/1979 | Berghauser et al. | 427/405 |
| 4,496,647 | 1/1985 | Kawabe et al. | 430/309 X |
| 4,557,856 | 12/1985 | Miyakawa et al. | 430/56 X |
| 5,045,432 | 9/1991 | West et al. | 430/278 |

FOREIGN PATENT DOCUMENTS 0190643 5/1990 European Pat. Off. .

Primary Examiner—Thomas J. Herbert, Jr.
Attorney, Agent, or Firm—Keil & Weinkauf

[57] ABSTRACT

In novel polyethyleneimine and polyvinylamine derivatives, the polyethyleneimines contain the structural elements I$_a$ and/or I$_b$

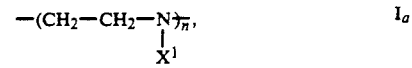

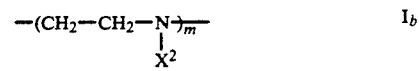

and the polyvinylamines contain the structural elements II$_a$, II$_b$ and II$_c$

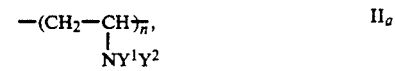

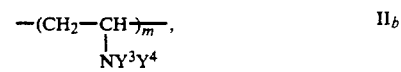

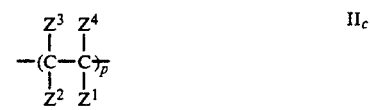

where, for the degrees of polymerization n, m and p, $n \geq 1$, $m \geq 0$ and $p \geq 0$, and $X^1$ is $CR^1R^2PO_3R^3R^4$ or $CR^1R^2SO_3R^3$, $X^2$ independently of $X^1$ is hydrogen, $CR^1R^2PO_3R^3R^4$ or $CR^1R^2SO_3R^3$, $Y^1$ and $Y^2$ independently of one another are each one or more $CHR^1PO_3R^3R^4$ or $CHR^1SO_3R^3$ groups or hydrogen, $Y^3$ and $Y^4$ independently of one another and of $Y^1$ and $Y^2$ are each hydrogen, $CHR^1PO_3R^3R^4$ or $CHR^1SO_3R^3$, and $Z^1$-$Z^4$ are identical or different inorganic and/or organic radicals, wherein $R^1$ and $R^2$ independently of one another are each hydrogen, $C_1$-$C_{12}$-alkyl or aryl and $R^3$ and $R^4$ independently of one another are each hydrogen, an alkali metal atom or $NR^5R^6R^7R^8$, where $R^5$ to $R^8$ are identical or different radicals selected from the group consisting of hydrogen, alkyl, aryl, hydroxyalkyl and benzyl.

Aluminum-based substrates coated with these polyethyleneimines and/or polyvinylamines are used for the production of offset printing plates.

7 Claims, No Drawings

POLYETHYLENEIMINE AND POLYVINYLAMINE DERIVATIVES, ALUMINUM-BASED SUBSTRATE MATERIALS COATED WITH THESE DERIVATIVES AND THE USE THEREOF FOR THE PRODUCTION OF OFFSET PRINTING PLATES

The present invention relates to novel polyethyleneimine and polyvinylamine derivatives, aluminum-based sheet-like, film-like or belt-like substrate materials (also referred to below as substrates) coated with these derivatives and the use thereof for the production of photosensitive recording elements and offset printing plates.

Substrates for offset printing plates are provided on one or both sides with a photosensitive layer (copying layer), with the aid of which a printable image is produced by a photomechanical method. After the production of the printable image, the substrate carries the printable image parts and, in the image-free parts (nonimage parts) also forms the hydrophilic image background for the lithographic printing process.

A substrate for photosensitive material for the production of lithographic plates must meet the following requirements:

a) Those parts of the photosensitive layer which are relatively readily soluble after exposure must be capable of being removed readily and completely from the substrate in the development step, for the production of the hydrophilic nonimage parts.

b) The substrate exposed in the nonimage parts must have a great affinity to water, ie. must be highly hydrophilic, in order to absorb water rapidly and permanently in the lithographic printing process and to be sufficiently repellent to the fatty printing ink.

c) The adhesion of the photosensitive layer before exposure and of the printable parts of the layer in the image parts after exposure must be sufficient.

Aluminum, steel, copper, brass or zinc sheets, plastic films or paper may be used as base material for such substrates. These raw materials are converted into substrates for offset printing plates by suitable operations, for example graining, dull chromium plating, surface oxidation and/or application of an intermediate layer. It is known that aluminum, probably the most frequently used base material for offset printing plates, is roughened on the surface by known methods such as dry brushing, wet brushing, sandblasting and chemical and/or electrochemical treatment. To increase the abrasion resistance, the roughened substrate can also be subjected to an anodization step to build up a thin oxide layer.

In the prior art, it is usual to subject such anodized substrates to a further treatment step to facilitate development of the imagewise exposed photosensitive layer, to increase the hydrophilicity or to improve the adhesion of the photosensitive layer. In this context, the patent literature describes, inter alia, methods such as treatment with silicates (cf. for example DE-A 2 532 769 or US-A 3 902 976) or treatment with complex fluorides (cf. for example DE-B 13 00 415 or US-A 3 440 050) or with polyvinylphosphonic acid (cf. for example DE-C 11 34 093 or US-A 3 276 868, DE-C 16 21 478 or US-A 4 153 461).

EP-B 190 643 discloses a substrate for offset printing plates which comprises untreated or pretreated aluminum or its alloys and carries, on at least one surface, a hydrophilic coating of a phosphonic acid compound, which consists of a) a polymer of acrylamidoisobutylenephosphonic acid or b) a copolymer of acrylamide and acrylamidoisobutylenephosphonic acid or c) a salt of a) or b) with a divalent or polyvalent metal cation. However, these known methods and coatings have disadvantages. Thus, the treatment with alkali metal silicates shortens the storage life.

DE-B 22 11 553 discloses a process for the densification of anodic oxide layers of aluminum and aluminum alloys in aqueous phosphonic acids or salts thereof and solutions containing calcium ions and having a pH of 5-6.5 at from 90° C. to the boiling point, in which process solutions which contain one or more phosphonic acids are used and the molar ratio of calcium ions to phosphonic acid is adjusted to not less than 2:1.

On the other hand, substrates treated with polyvinylphosphonic acid tend to exhibit aging phenomena on storage in the uncoated state These manifest themselves in decreasing hydrophilicity and in the poorer developability of negative-working layers which have not been coated until long after production of the substrate.

It is an object of the present invention to provide chemical compounds which, as an intermediate layer between the substrate and a positive-working, negative-working or electrophotographic photosensitive layer, increase the hydrophilicity of the nonimage parts without adversely affecting the adhesion of the photosensitive layer to the substrate, and thus avoid the stated disadvantages of known treatment agents.

We have found that this object is achieved, surprisingly, by the polyethyleneimines having the structural elements $I_a$ and/or $I_b$

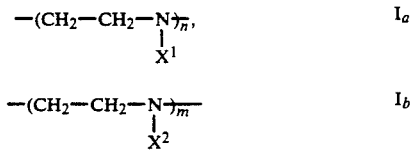

or the polyvinylamines having the structural elements $II_a$, $II_b$ and $II_c$

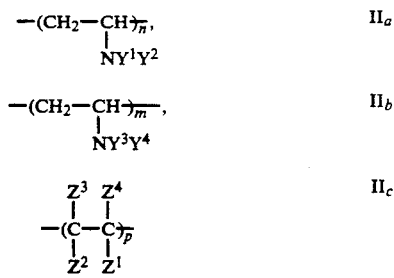

or by mixtures thereof where, for the degrees of polymerization n, m and p, $n \geq 1$, $m \geq 0$ and $p \geq 0$, and $X^1$ is $CR^1R^2PO_3R^3R^4$ or $CR^1R^2SO_3R^3$, $X^2$ independently of $X^1$ is hydrogen, $CR^1R^2PO_3R^3R^4$ or $CR^1R^2SO_3R^3$, $Y^1$ and $Y^2$ independently of one another are each one or more $CHR^1PO_3R^3R^4$ or $CHR^1SO_3R3$ groups or hydrogen, $Y^3$ and $Y^4$ independently of one another and of $Y^1$ and $Y^2$ are each hydrogen, $CHR^1PO_3R^3R^4$ or $CHR^1SO_3R^3$, and $Z^1$-$Z^4$ are identical or different inorganic and/or organic radicals, where $R^1$ and $R^2$ independently of one another are each hydrogen, $C_1$-$C_{12}$-alkyl or aryl and $R^3$ and $R^4$ independently of one another are each hydrogen, an alkali metal atom or $NR^5R^6R^7R^8$, where $R^5$ to $R^8$ are identical or different radicals selected from the group consisting of hydrogen, alkyl, aryl, hydroxyalkyl and benzyl.

Among these, polyethyleneimines and polyvinylamines in which $R^1$ and $R^2$ are each hydrogen and $R^3$ and $R^4$ are each hydrogen or an alkali metal atom are preferred according to the invention.

The molecular weight of the novel polyethyleneimines is from 150 to 2,500,000, preferably from 1,000 to 1,900,000, particularly preferably from 5,000 to 100,000.

The molecular weight of the novel polyvinylamines is from 1,000 to 2,500,000, preferably from 3,000 to 2,000,000, particularly preferably from 5,000 to 500,000.

All molecular weights are based on the weight average.

The novel polyvinylamines may contain up to 95, preferably from 10 to 90, particularly preferably from 20 to 80, % by weight of comonomers (structural element IIc).

Suitable comonomers are monoethylenically unsaturated $C_3$-$C_6$-carboxylic acids and esters, amides and nitriles thereof. Examples of such compounds are acrylic acid, methacrylic acid, crotonic acid, maleic acid, maleic anhydride, fumaric acid, itaconic acid, itaconic anhydride, methyl acrylate, ethyl acrylate, methyl methacrylate, butyl methacrylate, dimethylaminoethyl acrylate, dimethylaminoethyl methacrylate, monoethyl maleate, diethyl maleate, hydroxyethyl acrylate, hydroxypropyl acrylate, hydroxyethyl methacrylate, hydroxypropyl methacrylate, methacrylamidopropyldimethylammonium chloride, dimethylaminopropylacrylamide, acrylonitrile and methacrylonitrile. Sulfo-containing monomers, eg. vinylsulfonic acid, allylsulfonic acid, methallylsulfonic acid, styrenesulfonic acid, 3-sulfopropyl acrylate, 3-sulfopropyl methacrylate and acrylamidomethylpropanesulfonic acid are also suitable.

N-Vinylpyrrolidone, N-vinylcaprolactam, N-vinylimidazole, N-vinylmethylimidazole, N-vinyl-2-methylimidazole, vinyl acetate, vinyl propionate, vinyl butyrate, styrene, olefins of 2 to 10 carbon atoms, such as ethylene, propylene, isobutylene, hexene or diisobutene, and vinyl alkyl ethers, such as methyl vinyl ether, ethyl vinyl ether, n-butyl vinyl ether, isobutyl vinyl ether, hexyl vinyl ether and octyl vinyl ether, and mixtures of the stated monomers are furthermore suitable.

Acidic monomers, ie. ethylenically unsaturated monomers which contain carboxyl or sulfo groups, can be used in the polymerization, in particular in aqueous solution, in partially or completely neutralized form. Alkali metal bases, such as sodium hydroxide solution and potassium hydroxide solution, or ammonia or amines, eg. trimethylamine, ethanolamine or triethanolamine, are preferably used for the neutralization.

The basic monomers are preferably employed in the form of the salts with mineral acids, eg. hydrochloric acid or sulfuric acid, or in quaternized form (suitable quaternizing agents are, for example, dimethyl sulfate, diethyl sulfate, methyl chloride, ethyl chloride or benzyl chloride).

The novel polyethyleneimines and polyvinylamines may contain phosphonomethyl groups $CR^1R^2PO_3R^3R^4$ or sulfonomethyl groups $CR^1R^2SO_3R^3$ or both groups simultaneously. Polyethyleneimines and polyvinylamines which have either phosphonomethyl or sulfonomethyl groups are preferred. The novel polyethyleneimines or polyvinylamines may contain small amounts of imino or amino nitrogen atoms where the one hydrogen atom or the two hydrogen atoms, respectively, are not substituted. In the novel polymers, however, not less than 15% of the imino or amino groups are substituted.

The present invention furthermore relates to aluminum-based substrates coated with the novel polyethyleneimines and/or polyvinylamines.

These substrates can be obtained by applying the novel compounds or mixtures thereof, in general in the form of their aqueous solutions (concentration range: from 0.01 to 5% by weight) by conventional application methods, such as spraying or immersion, to the pretreated aluminum substrate. The novel polyethyleneimines and polyvinylamines can be used with or without the addition of acids, alkalis or pH buffers. An excess is removed if necessary and the coated substrate is dried at from 20 to 130° C.

Photosensitive recording elements consisting of an aluminum-based substrate mechanically, chemically and/or electrochemically pretreated in a conventional manner and if necessary anodically oxidized and a positive-working, negative-working or electrophotographic photosensitive layer can be produced by applying a thin hydrophilicity-imparting layer which contains, and preferably consists of, the novel compounds between the aluminum substrate and the photosensitive layer.

The present invention accordingly also relates to the use of the aluminum substrates coated with the novel polyethyleneimines and/or polyvinylamines for the production of offset printing plates and photosensitive recording elements.

The novel polyethyleneimines and polyvinylamines are prepared, for example, by phosphonomethylation and/or sulfonomethylation of corresponding unsubstituted polyethyleneimines and polyvinylamines by a known method (cf. K. Moedritzer and R. R. Irani, J. Org. Chem. 31 (1966), 1603; D. Redmore, Topics in Phosphorus Chemistry 8 (1976), 515).

The unsubstituted polyethyleneimines can be prepared by cationic or anionic polymerization of ethyleneimine. The unsubstituted polyvinylamines can be prepared, for example, by polymerization of N-vinylformamide and subsequent removal of the protective groups by hydrolysis.

For the phosphonomethylation, the unsubstituted polymers are reacted, for example, with formaldehyde and phosphorous acid in a strongly acidic medium, generally containing hydrochloric acid, for reaction times of from 5 to 30, preferably from 15 to 25, hours.

As a rule, the completely phosphonomethylated polymers are then obtained. When less than the stoichiometric amounts of formaldehyde and phosphorous acid are used, products or product mixtures which are only partially phosphonomethylated are isolated.

Hence, if complete conversion is desired, it is advisable to use the other reagents sufficiently in excess of the stoichiometric amount relative to the amino or imino groups of the polymers to ensure exhaustive phosphonomethylation.

For working up after phosphonomethylation is complete, excess acid and other starting materials and volatile byproducts can be very substantially expelled initially by treating the reaction mixture containing hydrochloric acid with steam.

The reaction products may be used in the form of these aqueous solutions either as they are or after evaporating down or concentrating.

However, it may be advantageous to subject the products to an additional purification before further use.

For this purpose, the solutions or mixtures of the polymeric acid which are obtained after the steam treatment and in some cases are very viscous can be reacted with aqueous solutions of alkali metal hydroxides. The polymers may then be obtained in good purity in the form of their alkali metal salts by precipitation from suitable solvents, for example from methanol.

It is also possible to add the concentrated, still acidic solutions to a methanolic alkali metal hydroxide solution, so that neutralization to the alkali metal salts and precipitation of the latter take place simultaneously.

The sulfonomethylation or the simultaneous sulfonomethylation and phosphonomethylation can be effected in a similar manner, sulfurous acid being used instead of or in addition to phosphorous acid.

In the novel polymers, from 15 to 95, preferably from 25 to 80, particularly preferably from 35 to 70, % of the amino or imino groups are substituted by such groups.

The aluminum substrates to be used according to the invention are mechanically, chemically and/or electrochemically pretreated in a conventional manner and if necessary anodically oxidized. Pretreatment methods of this type are described in, for example, Wernick, Pinner, Zurbrügg, Weiner, Die Oberflächenbehandlung von Aluminium, Eugen G. Leuze Verlag, 1977.

After the treatment of the pretreated aluminum substrate with the solution of the novel polyethyleneimines and/or polyvinylamines and drying of the thin layer, the aftertreated aluminum substrate is provided with the photosensitive layer in a conventional manner. This photosensitive layer may be composed of a one-layer or two-layer system.

Suitable photosensitive layers are in principle all layers which, after exposure and, if necessary, with subsequent development and/or fixing, give an image-bearing surface from which it is possible to produce prints. Said layers are applied to one of the conventional substrates either by the manufacturer of presensitized printing plates or directly by the user.

In addition to the layers used in many areas and containing silver halides, various others are also known, as described in, for example, Light-Sensitive Systems, J. Kosar, John Wiley & Sons, New York 1965: colloid layers containing chromates and dichromates; layers which contain unsaturated compounds and in which these compounds are isomerized, rearranged, cyclized or crosslinked on exposure; layers which contain photopolymerizable compounds and in which monomers or prepolymers polymerize, if necessary with the aid of an initiator, on exposure; and layers containing o-diazoquinones such as naphthoquinonediazides, p-diazoquinones or diazonium salt condensates.

The suitable layers also include the electrophotographic layers, ie. those which contain an inorganic or organic photoconductor. In addition to the photosensitive substances, these layers may furthermore contain other components, such as resins, dyes or plasticizers.

Offset printing plates whose substrates were treated according to the invention have a substantially less pronounced dullness and improved hydrophilicity compared with known offset printing plates. The adhesion of the photosensitive layer to the substrate surface is also substantially better.

EXAMPLES

In the Synthesis Example, the synthesis of a novel polyethyleneimine is described by way of example.

In the Examples or Comparative Examples, four aluminum sheets T1 to T4 pretreated in different ways were subjected to aftertreatments with the novel hydrophilizing chemicals B1 to B13 and with the known hydrophilizing chemicals V1 to V5.

Tests for dullness (D), hydrophilicity (H), correctability (C) and printing characteristics (P) were carried out on the aftertreated substrate sheets and on the sheets obtained therefrom by coating with a photosensitive layer.

Synthesis Example

Preparation of a phosphonomethylated polyethyleneimine derivative 200 ml of concentrated hydrochloric acid and 200 g of phosphorous acid were added to 110 g of polyethyleneimine dissolved in 500 ml of water, and the mixture was heated until it refluxed. 250 g of an aqueous, 30% strength formaldehyde solution were then slowly added dropwise At the end of the addition, stirring was continued for a further 20 hours with refluxing. Volatile components and excess reagents were removed by treatment with steam for three hours, and the resulting solution was evaporated down to about one third of its volume.

To purify the phosphonomethylated polymer, it was precipitated as the sodium salt by adding the still acidic, concentrated solution dropwise to ten times its volume of methanolic sodium hydroxide solution; the amount of NaOH used should correspond to the acid number equivalent of the concentrated reaction mixture. The precipitated sodium salt was filtered off, washed with methanol and dried. About 450 g of the Na salt of the phosphonomethylated polyethyleneimine were then obtained as a pale yellow powder.

The mass ratio of organically bound phosphorus to organically bound nitrogen determined by elemental analysis was 1.7, corresponding to a degree of phosphonomethylation of 77%.

Aluminum substrates

The following aluminum sheets T1 to T4 were used.
T1: An aluminum sheet electrochemically roughened by treatment with alternating current in aqueous hydrochloric acid, oxidized anodically in aqueous sulfuric acid and having a mean oxide layer weight of 3 g/m$^2$ and a mean Ra value of 0.6–0.7.
T2: As with T1 but with a mean Ra value of 0.3–0.4.
T3: An aluminum sheet electrochemically roughened by treatment with alternating current in aqueous nitric acid, oxidized anodically in sulfuric acid and having a mean oxide layer weight of 3 g/m$^2$ and a mean Ra value of 0.6–0.7.
T4: As with T3 but with a mean Ra value of 0.3–0.4.

Aftertreatment

In all Examples (B1-B13) and Comparative Examples (V1-V5), the substrates pretreated as above were immersed for 60 seconds, under the conditions stated in Table 2 (temperature, concentration, pH), into a solution of the corresponding hydrophilizing chemicals and then thoroughly washed with water and dried at 80° C.

The following novel polymers (B1–B8: polyethyleneimines; B9–B13: polyvinylamines) were used as hydrophilizing chemicals for the novel aftertreatment (cf. Table 1):

TABLE 1

| No. | Structural element | Molecular weight | $X^1$ or $Y^1$, $Y^2$ |
|---|---|---|---|
| B1 | Ia | 2 000 | $CH_2PO_3H_2$ |
| B2 | Ia | 15 000 | $CH_2PO_3H_2$ |
| B3 | Ia | 1 800 000 | $CH_2PO_3H_2$ |
| B4 | Ia | 2 000 | $CH_2SO_3H$ |
| B5 | Ia | 3 000 | $CH_2SO_3H$ |
| B6 | Ia | 15 000 | $CH_2SO_3H$ |
| B7 | Ia | 40 000 | $Ch_2SO_3H$ |
| B8 | Ia | 1 800 000 | $CH_2SO_3H$ |
| B9 | IIa | 6 000 | H, $CH_2PO_3H$ |
| B10 | IIa | 40 000 | H, $CH_2PO_3H$ |
| B11 | IIa | 1 600 000 | H, $CH_2PO_3H$ |
| B12 | IIa | 2 000 000 | H, $CH_2PO_3H$ |
| B13 | IIa | 40 000 | H, $CH_2SO_3H$ |

The following comparative substances were used as hydrophilizing chemicals for the known aftertreatment:
V1: Water
V2: Ammonium acetate
V3: Sodium silicate
V4: Polyvinylphosphonic acid
V5: Trihydroxysilylethylphosphonic acid Photosensitive layers The substrate sheets aftertreated with the novel and known hydrophilizing chemicals described above were provided with the following photosensitive layers:

L1: Positive copying layer consisting of 70% by weight of a cresol-formaldehyde novolak (having a softening range of 105°–120° C. according to DIN 53,181), 27% by weight of a reaction product of 1,2-naphthoquinone-2-diazide-5-sulfonic acid with the condensate of acetone and pyrogallol, 2% by weight of 4-(p-tolylmercapto)-2,5-diethoxybenzenediazonium hexafluoroarsenate and 1% by weight of Crystal Violet.

L2: Positive, reversible copying layer consisting of 70% by weight of a cresol/formaldehyde novolak (having a softening range of 105°–120° C. according to DIN 53,181), 27% by weight of a reaction product of 1,2-naphthoquinone-2-diazide-4-sulfonic acid with the condensate of formaldehyde- and p-cresol, 2% by weight of 4-(p-tolylmercapto)-2,5-diethoxybenzenediazonium hexafluoroarsenate and 1% by weight of Crystal Violet.

L3: Negative copying layer consisting of 87.5% by weight of a binder which contains 12% by weight of methacrylanilide, 59% by weight of ethyl acrylate, 20% by weight of acrylonitrile and 9% by weight of methacrylic acid, 10% by weight of a condensate of p-diazodiphenylamine sulfate with formaldehyde, isolated as the hexafluorophosphate (the condensation was carried out in sulfuric acid) and 2.5% by weight of a mixture of triarylmethane dyes, consisting of 70% by weight of Flexobau ® 680 and 30% by weight of Hektoviolett ® 610.

L4: Electrophotographic copying layer consisting of 54.6% by weight of a binder which contains 70% by weight of styrene, 24% by weight of acrylic acid and 6% by weight of maleic anhydride, 45% by weight of bis-(dimethylaminophenyl)-oxadiazole and 0.4% by weight of Rhodamine B Base (C.I. Solvent Red 49).

The substrate sheets were coated with the photosensitive layers by application with a knife coater, a spin coater or a roller, the method of application having no effect on the properties investigated.

The coatings were applied so that, after drying at up to 120° C., the copying layer had a layer weight of 1.8–2.3 g/m$^2$ and residual solvent contents of less than 5% by weight. Comparative investigations with the photosensitive layer L1 showed that variation of the layer weight in the range 1.0–3.5 g/m$^2$ has no adverse effect on the properties investigated.

The solvents used were ethylene glycol monomethyl ether and propylene glycol monomethyl ether and mixtures of these with acetone. Comparative experiments using the photosensitive layer L1 with a number of organic solvents and solvent mixtures showed that all organic solvents which do not react with the charging materials may also be used.

Production of the printing plates:

The corresponding printing plates could be produced in the conventional manner from the printing plates produced as described above. In the case of the printing plates having the photosensitive layers L1–L3, the printing plates were exposed through a test transparency (UGRA offset test wedge 1982) using a commercial metal halide exposure unit (5.5 kW, lamp spacing about 70 cm) and then developed with a commercial positive or negative developer. The reversal of the positive, reversible copying layer was carried out by heating the imagewise exposed plate to 100°–150° C. for 30–300 seconds and then effecting uniform post-exposure.

In the case of the printing plates having the electrophotographic copying layer L4, the layer was charged with a corona and an associated 7 kV high-voltage source and was exposed through a test transparency, which also contained the UGRA offset test wedge 1982, in a process camera to halogen lamps. After application of a commercial toner to the latent charge image formed as a result of exposure, the resulting image of the transparency was fixed by the action of heat. For conversion into a printing plate, the aluminum sheet with the toner-treated layer was developed with the aid of an aqueous commercial alkaline developer.

Tests

The following four tests were carried out on the printing plates or substrate sheets aftertreated in a known manner and according to the invention. The test results obtained are shown in Table 2. Since there were no differences for the sheets T1 to T4 pretreated in different ways, they are not shown in Table 2.

Dullness (D):

To evaluate the dullness, 5×10 cm printing plates were developed on half their area by the methods described above.

The bared nonimage parts were then evaluated visually by comparison with the corresponding uncoated substrate sheets, the rating A, B or C being awarded.

A = No dullness (brightness of the bared nonimage parts corresponds to that of the uncoated sheet)

B = Very slight to slight dullness (brightness of the bared nonimage parts is slightly less than in the case of the uncoated sheet)

C = Moderate to pronounced dullness (not suitable for offset printing plates)

Hydrophilicity (H):

The uncoated, aftertreated substrate sheets were provided with a corrected area, then inked by wiping over with offset-typical printing ink and then washed off with water. The procedure was repeated with a further sample of the test sheet, said sheet being immersed in a commercial developer for about 45 seconds prior to inking. The rating A, B or C was awarded.

A = Very hydrophilic; no smearing (washed completely clean both with and without developer treatment; suitable for difficult applications in offset printing)

B = Hydrophilic; no smearing (slight smearing without treatment with a developer, as for A when treated with a developer; still suitable for offset printing)

C = Insufficiently hydrophilic or smearing (cannot be washed clean even after treatment with a developer; unsuitable for offset printing)

Correctability (C):

Test sheets were produced as described for the test for dullness. After development, a correction spot was applied using a commercial correcting agent, in such a way that a corrected zone was formed in both the developed and the undeveloped parts of the sheet. The correctability was evaluated by assigning the visually determined rating A, B or C.

A = Very readily correctable (no optical differences detectable in the corrected parts)

B = Correctable (slight optical differences detectable in the corrected and uncorrected, developed parts)

C = Not correctable (pronounced colour differences, not suitable for offset printing)

Print test (P):

Prints were prepared with the printing plates described above on the Heidelberg GTO sheet-fed offset press and were evaluated with regard to the wedge steps, microlines and dots transferred during printing and with respect to the permanence of the correction made.

The rating A, B or C was awarded with regard to suitability as an offset printing plate.

A = Very suitable, long press life (corrected spot and UGRA wedge and free-running characteristics unchanged for up to more than 150,000 prints)

B = Suitable, still sufficiently long press life (corrected spot and UGRA wedge and free-running characteristics unchanged for up to about 80,000 prints)

C = Unsuitable, press life too short (changes during printing within the first 70,000 prints: losses in the solid area, loss of the half step wedge, losses of microlines or dots or smearing at the correction spot)

TABLE 2

| Photo-sensitive layer | Aftertreatment | | | Test results | | | |
|---|---|---|---|---|---|---|---|
| | No. | pH | °C. | % by wt. | D | H*** | C | P |
| L1 or L2 | B1 | 3–7 | 20–90 | 0.3 | B | A | B | A |
| | B2 | 3–7 | 20–90 | 0.3 | A | A | A | A |
| | B3 | 3–7 | 20–90 | 0.3 | A | A | A | A |
| | B4 | 5 | 25 | 0.5 | A | A | A | A |
| | B6 | 8 | 25 | 0.2 | B | B | B | A |
| | B8 | 8 | 25 | 0.4 | A | A | A | A |
| | B9 | 8 | 50 | 0.5 | B | A | B | A |
| | B10 | 3.7 | 50–90 | 0.2–0.4 | A | A | A | A |
| | B12 | 8 | 50 | 0.3 | B | A | B | A |
| | B13 | 8 | 50 | 0.3–0.5 | A | A | B | A |
| L1 or L2 | V1 | 3 | 50 | — | C | C | B | * |
| | V1 | 6.5 | 50 | — | C | B | C | * |
| | V2 | 5.5 | 80 | 0.1 | C | B | C | * |
| | V3 | >12 | 80 | 1.0 | C | C | C | * |
| | V4 | 1–3 | 50–80 | 0.2–1.5 | C | B | C | * |
| | V5 | 3.5 | 50 | 0.15 | C | B | C | * |
| | V5 | 1.5 | 50 | 1.0 | A | A | A | C |
| | V5 | 1.5 | 50 | 0.5 | A | B | A | B |
| L3 | B2 | 6.5 | 50 | 0.3 | A | A | ** | A |
| | B7 | 8 | 50 | 0.25 | B | A | ** | B |
| | B10 | 9.5 | 50 | 0.5 | A | B | ** | B |

TABLE 2-continued

| Photo-sensitive layer | Aftertreatment | | | Test results | | | |
|---|---|---|---|---|---|---|---|
| | No. | pH | °C. | % by wt. | D | H*** | C | P |
| | B13 | 8 | 80 | 1.0 | A | A | ** | B |
| L3 | V1 | 6.5 | 50 | — | C | C | ** | * |
| | V1 | 8 | 50–80 | — | C | C | ** | * |
| | V2 | 5.5 | 80 | 0.1 | C | C | ** | * |
| | V3 | >12 | 80 | 1.0 | B | B | ** | B |
| | V4 | 1–3 | 50–80 | 0.2–0.5 | C | B | ** | * |
| | V5 | 1–3 | 80 | 1.5 | A | B | ** | C |
| L4 | B2 | 5 | 50 | 1.5 | A | A | ** | B |
| | B5 | 2 | 50 | 1.0 | B | A | ** | A |
| | B11 | 7 | 25 | 1.5 | A | B | ** | B |
| | B13 | 6–8 | 50–80 | 2.5 | B | B | ** | B |
| L4 | V1 | 6.5 | 50 | — | C | C | ** | * |
| | V2 | 5.5 | 80 | 0.1 | C | C | ** | * |
| | V3 | >12 | 80 | 1.0 | C | C | ** | * |
| | V4 | 1–3 | 50 | 0.5 | B | B | ** | B |
| | V5 | 3.5 | 50 | 0.5 | B | B | ** | B |

*The dullness and/or hydrophilicity were rated as C and the printing test was therefore dispensed with.
**Not tested.
***The hydrophilicity was determined for aftertreated Al sheets without the photosensitive layer.

We claim:

1. A polyethyleneimine or polyvinylamine derivative, wherein the polyethyleneimine contains the structural element $I_a$ or $I_b$ $$-(CH_2-CH_2-N)_{\overline{n}}, \quad I_a$$
$$\phantom{-(CH_2-CH_2-N)_{\overline{n}}}|$$
$$\phantom{-(CH_2-CH_2-N)_{\overline{n}}}X^1$$

$$-(CH_2-CH_2-N)_{\overline{m}} \quad I_b$$
$$\phantom{-(CH_2-CH_2-N)_{\overline{m}}}|$$
$$\phantom{-(CH_2-CH_2-N)_{\overline{m}}}X^2$$

and the polyvinylamine contains the structural elements $II_a$, $II_b$ and $II_c$ $$-(CH_2-CH)_{\overline{n}}, \quad II_a$$
$$\phantom{-(CH_2-CH)_{\overline{n}}}|$$
$$\phantom{-(CH_2-CH)_{\overline{n}}}NY^1Y^2$$

$$-(CH_2-CH)_{\overline{m}}, \quad II_b$$
$$\phantom{-(CH_2-CH)_{\overline{m}}}|$$
$$\phantom{-(CH_2-CH)_{\overline{m}}}NY^3Y^4$$

$$\phantom{-}Z^3 \phantom{-}Z^4 \quad II_c$$
$$\phantom{-}| \phantom{--}|$$
$$-(C-C)_{\overline{p}}$$
$$\phantom{-}| \phantom{--}|$$
$$\phantom{-}Z^2 \phantom{-}Z^1$$

where, for the degrees of polymerization n, m and p, $n \geq 1$, $m \geq 0$ and $p \geq 0$, and $X^1$ is $CR^1R^2PO_3R^3R^4$ or $CR^1R^2SO_3R^3$, $X^2$ independently of $X^1$ is hydrogen, $CR^1R^2PO_3R^3R^4$ or $CR^1R^2SO_3R^3$, $Y^1$ and $Y^2$ independently of one another are each one or more $CHR^1PO_3R^3R^4$ or $CHR^1SO_3R^3$ groups or hydrogen, $Y^3$ and $Y^4$ independently of one another and of $Y^1$ and $Y^2$ are each hydrogen, $CHR^1PO_3R^3R^4$ or $CHR^1SO_3R^3$, and $Z^1$–$Z^4$ are identical or different inorganic and/or organic radicals, wherein $R^1$ and $R^2$ independently of one another are each hydrogen, $C_1$–$C_{12}$-alkyl or aryl and $R^3$ and $R^4$ independently of one another are each hydrogen, an alkali metal atom or $NR^5R^6R^7R^8$, where $R^5$ to $R^8$ are identical or different radicals selected from the group consisting of hydrogen, alkyl, aryl, hydroxyalkyl and benzyl.

2. A polyethyleneimine or polyvinylamine derivative as claimed in claim 1, wherein m is 0.

3. A polyethyleneimine or polyvinylamine derivative as claimed in claim 1, wherein p is 0.

4. A polyethyleneimine or polyvinylamine derivative as claimed in claim 1, wherein $R^1$ and $R^2$ are each hydrogen and $R^3$ and $R^4$ are each hydrogen or an alkali metal atom.

5. A polyethyleneimine or polyvinylamine derivative as claimed in claim 1, wherein the weight average molecular weight of the polyethyleneimine is from 150 to 2,500,000 and that of the polyvinylamine is from 1,000 to 2,500,000.

6. A polyethyleneimine or polyvinylamine derivative as claimed in claim 1, wherein the weight average molecular weight of the polyethyleneimine is from 5,000 to 100,000 and that of the polyvinylamine is from 5,000 to 500,000.

7. An aluminum-based substrate in the form of a sheet, a film, or a belt, having a hydrophilic layer, wherein said layer contains at least one polyethyleneimine or polyvinylamine derivative as defined in claim 1.

* * * * *